United States Patent [19]

McKee et al.

[11] Patent Number: 4,704,740

[45] Date of Patent: Nov. 3, 1987

[54] DISPLAY PAGER WITH SEPARATE READOUT MODULE

[75] Inventors: John M. McKee, Coral Springs; Roberto Kurcbart, Boca Raton, both of Fla.

[73] Assignee: Motorola, Inc., Schaumburg, Ill.

[21] Appl. No.: 15,504

[22] Filed: Feb. 9, 1987

Related U.S. Application Data

[63] Continuation of Ser. No. 734,305, May 15, 1985, abandoned.

[51] Int. Cl.⁴ .............................................. H04B 1/08
[52] U.S. Cl. .................................... 455/348; 455/158; 455/349; 455/351
[58] Field of Search ............................... 455/347–349, 455/351, 158; 340/825.44, 825.55; 116/241, 260

[56] References Cited

U.S. PATENT DOCUMENTS

| | | | |
|---|---|---|---|
| 3,970,782 | 7/1976 | Fenne | 455/349 |
| 4,081,751 | 3/1978 | Maddaloni | 455/349 |
| 4,194,157 | 3/1980 | Uno | 455/348 |
| 4,286,335 | 8/1981 | Eichler et al. | 455/351 |
| 4,578,789 | 3/1986 | McKee et al. | 455/351 |

Primary Examiner—Robert L. Griffin
Assistant Examiner—Curtis A. Kuntz
Attorney, Agent, or Firm—Martin J. McKinley; Daniel K. Nichols; Joseph T. Downey

[57] ABSTRACT

A liquid crystal display module with self contained display decoder circuitry is attached to a radio frame with a minimum of electrical interconnections. Module assembly and attachment are both accomplished without the use of tools. Attaching the module to the frame interlocks the module to prevent accidental disassembly and places a preload force on the electrical interconnections to insure good electrical continuity. Ambient light reflection provides primary display illumination while lamps, controlled by an integral switch, provide secondary illumination.

10 Claims, 3 Drawing Figures

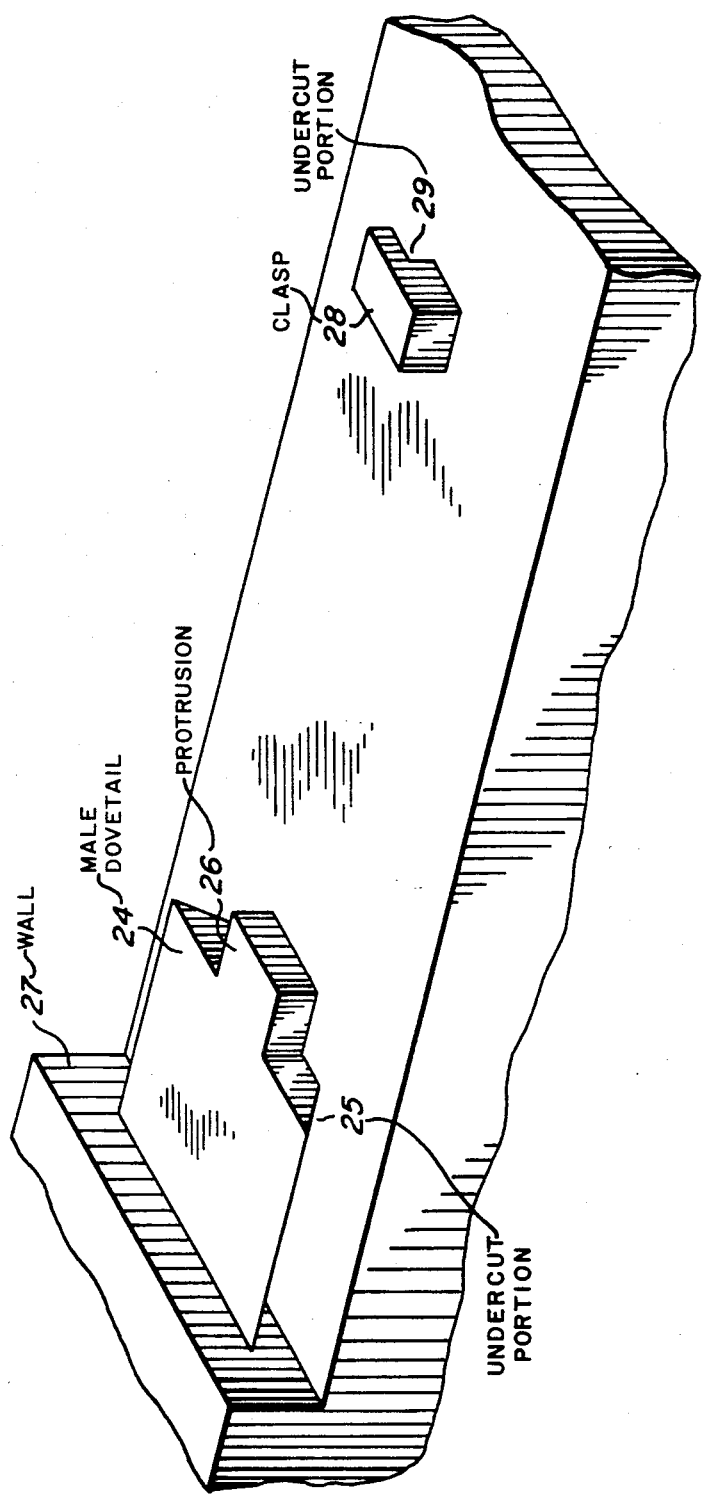

DISPLAY PAGER WITH SEPARATE READOUT MODULE

This is a continuation of application Ser. No. 734,305, filed May 15, 1985 now abandon.

BACKGROUND OF THE INVENTION

This invention relates to the field of data display modules, and more particularly to detachable data display modules that find application in selective call personal paging receivers.

Selective call personal paging receivers ("pagers") can be categorized according to the method they use to convey the transmitted message to the user of the pager. "Tone only" pagers simply emit a short audible tone to alert the user that he or she has a message, but do not actually transmit the message to the user. After receiving a "tone only" page the user typically calls a prearranged telephone number to receive the actual message. "Tone and voice" pagers include the necessary audio circuits and a small speaker to permit the user to hear a verbal message following the alert tone. Another category of pagers is "display" pagers which include a small alphanumeric character display whereby a short message, such as a telephone number, may be displayed. One advantage to "display" pagers is that they convey the message silently, maintaining the user's message in confidence.

In paging systems, each individual pager has a unique address code, and a base station activates a particular pager by first transmitting its unique address code. In a "tone only" system, only the address code need be transmitted to the pager. Recently developed paging systems now transmit address codes and other information to the pager using a digital format. Given such a digital system, a "display" pager uses the same basic circuits as a "tone only" pager, but additionally includes a display, display decoder circuitry, and circuitry or software to decode the message which follows the address code. Accordingly, to produce a "display" pager it is advantageous for a manufacturer to make a display module that attaches to its more basic line of "tone only" pagers. Therefore, by adding a display module with display decoder circuitry, plus additional software or hardware to decode the message, the "tone only" pager is upgraded to a "display" pager. This approach saves both development and manufacturing costs and permits the manufacturer to introduce a "display" pager into its product line that is based on a proven product.

SUMMARY OF THE INVENTION

Accordingly, it is an object of the invention to provide a low power data display module that is small in size, light in weight, and may be assembled without the use of tools.

It is another object of the invention to provide a display module that contains display decoder circuitry to minimize the number of electrical contacts between the module and the pager to which it is attached.

It is another object of the invention to provide a display module that attaches and detaches to a pager without the use of tools, and whereby the attachment of the module to the pager places a preload force on the electrical contacts and also interlocks the module parts to prevent the accidental disassembly of the module.

Still another object of the invention is to provide for display backlighting, controlled by a switch integral with the module.

Briefly, the invention includes a radio receiver having a supporting frame and a detachable alphanumeric character display module. The display module includes a display module housing which contains a character display. A retainer plate retains the character display within the module housing along with other coxponents. Means are provided for slidably attaching the retainer plate to the module housing. First and second means are provided for slidably attaching the display module to the frame. Each module attaching means has a first part located on the frame and a second part located on the display module. A first set of interconnecting electrical contacts located on the radio receiver and a second set located on the display module are forcibly engaged when the display module is attached to the frame.

BRIEF DESCRIPTION OF THE DRAWINGS

FIG. 3 is a detail of the male dovetail and clasp located on the pager frame.

DETAILED DESCRIPTION OF THE PREFERRED EMBODIMENT

Figure 1:
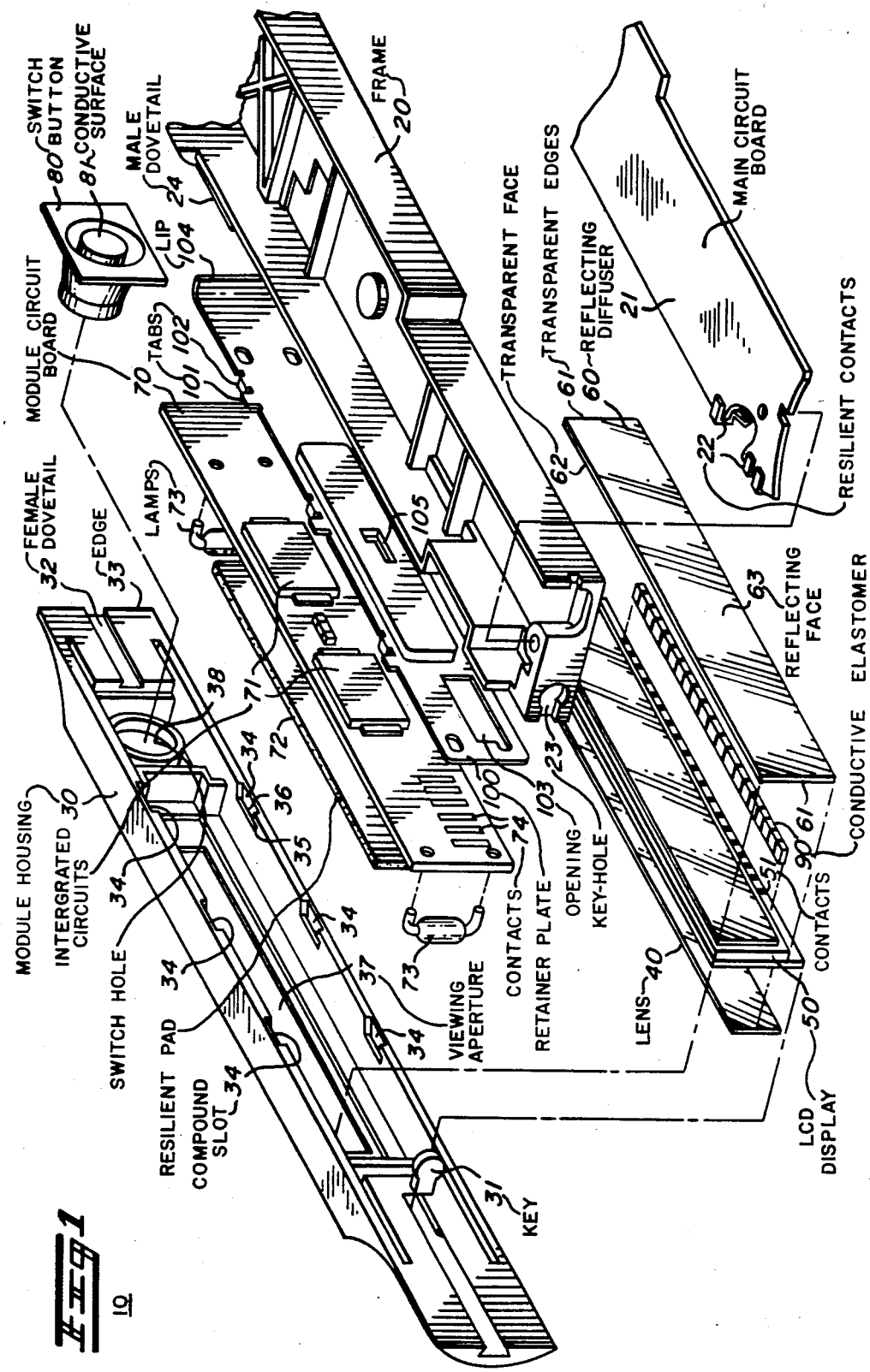
FIG. 1 is an exploded view of the display module including the pager frame to which the module attaches.

Referring to FIG. 1, wherein an exploded view of the display module, generally designated 10, and frame 20 are illustrated. The frame 20, which can be constructed from a suitable plastic such as polycarbonate, supports a radio receiver circuit board 21, upon which resilient electrical contacts 22 are soldered to appropriate soldering pads on the radio board 21. The radio circuit board 21 is preferably constructed from a polyimide material, but other materials which are well known in the art are also suitable. The electrical contacts 22 may be constructed of gold plated beryllium copper. A keyhole 23 and a male dovetail 24 are located on the frame 20. The male dovetail 24 is barely visible in FIG. 1 but can be seen in more detail in FIG. 3. The male dovetail 24 has an undercut portion 25 with a protrusion 26 at one end and a wall 27 at the other end. Attached to the frame 20 between the male dovetail 24 and the keyhole 23 is a clasp 28 with an undercut portion 29.

Returning to FIG. 1, the display module housing 30 is preferably constructed of a suitable plastic such as polycarbonate and is approximately 3" long, 0.4" high, and 0.2" deep. At one end of the module housing 30 is a protruding key 31 and at the other end is a female dovetail 32. When the display module 10 is attached to the frame 20, the key 31 and the female dovetail 32 mate respectively with the keyhole 23 and the male dovetail 24. One purpose of the protrusion 26 is to help align the female dovetail 32 over the male dovetail 24 when the display module 10 is being attached to the frame 20. After attachment, wall 27 butts up against edge 33 of module housing 30, thereby providing a suitable stop for the display module 10. The module housing 30 has six compound slots, each generally designated 34. These compound slots 34 are visible in FIG. 1, but can be seen in more detail in FIG. 2. Each compound slot 34 has a horizontal portion 35 and a vertical portion 36; their function will be described in greater detail later. Returning to FIG. 1, the module housing 30 also has an aperture 37 and a hole 38.

Lens 40 is positioned over the aperture 37 in the module housing 30. Lens 40 is constructed of a transparent plastic such as polycarbonate and may have a suitable anti-glare outer surface. Located behind the lens 40 is an alphanumeric liquid crystal display 70 of the type well known in the art. At the base of the display 50 are electrical display contacts 51 which are appropriately connected to the various segments of the display. A reflecting diffuser 60, preferably constructed from acrylic plastic, has transparent edges 61 and is positioned immediately behind the display 50. The diffuser 60 is substantially the same length as the display 50 but its height is shorter, as it does not project over the display contacts 51. The face 62 of the diffuser 60 adjacent to the display 50 and the edges 61 of the diffuser are transparent. The other face 63 of the diffuser 60 is reflective. The primary source of display illumination is ambient light. After ambient light passes through the lens 40, the display 50, and the diffuser 60, it strikes the reflective face 63 of the diffuser 60 and is reflected back, again passing through the display, thereby improving the display visibility.

A module circuit board 70, containing appropriate display decoder and driver circuitry 71, is positioned behind the diffuser 60, and is preferably constructed of a polyimide material. A pad 72, composed of a low density resilient foam material, is attached to the back of the module board 70, and is situated between the module board and the diffuser 60. The thickness of the pad 72 is selected such that it is in compression when all the respective parts of the module 10 are assembled into the housing 30, thereby preventing any shifting of those parts. Alternatively, the pad 72 may be attached to the back of the diffuser 60. If ambient light conditions are insufficient to illuminate the display 50, lamps 73 provide secondary display illumination. The lamps 73 are attached to module board 70 and are position adjacent to opposite transparent edges 61 of diffuser 60. A switch button 80, composed of an elastic material such as silicone rubber, has a conductive surface 81, preferably of gold, which activates the lamps 73 when the user compressed the switch button and the conductive surface shorts printed circuit conductors (not shown) on the module board 70. Light emitted from the lamps 73 enters the diffuser 60 at opposite transparent edges 61 and travels the length of the diffuser. As the light travels through the diffuser 60, it is scattered and exits the diffuser through its transparent face 62, whereupon it passes through the display 50 and out through the lens 40.

A set of preferably gold plated interface contacts 74 on the retainer plate side of the module board 70 come into contact with the resilient contacts 22 when the display module 10 is attached to the frame 20, thereby providing the electrical interface between the frame and the display module. A conductive elastomer 90 is positioned between and in contact with the display contacts 51 and another set of display contacts (not shown) on the display side of the module board 70, thereby forming an electrical interconnection between the module board and the display 50. A suitable conductive elastomer 90 is a "Tecknit" brand elastomer ("Tecknit" is a registered trademark of the Technical Wire Products Corporation), although other well known elastomers are also suitable.

To assemble the display module 10, the parts are inserted into the housing 30 in substantially the following order: lens 40, display 50, diffuser 60, switch button 80, conductive elastomer 90, and module board 70. A retainer plate 100 secures the parts in the module housing 30. The retainer plate 100 is substantially a rectangular metallic plate, preferably constructed of nickle silver, having six pairs of protruding tabs 101 and 102 (only three pairs of tabs are visible in FIG. 1, the remaining three pairs are positioned on the lower edge of the retainer plate opposite the three pairs that are shown). The first set of six tabs 101 lie in the plane of the retainer plate 100, while the second set of six tabs 102 are perpendicular to the plane of the retainer plate. The six compound slots 34 (FIG. 2), formed in the walls of the module housing 30 receive the six pairs of tabs 101 and 102. The six compound slots 34 each have horizontal portions 35 designed to receive the first set of tabs 101, and vertical portions 36 designed to receive the second set of tabs 102.

Figure 2:
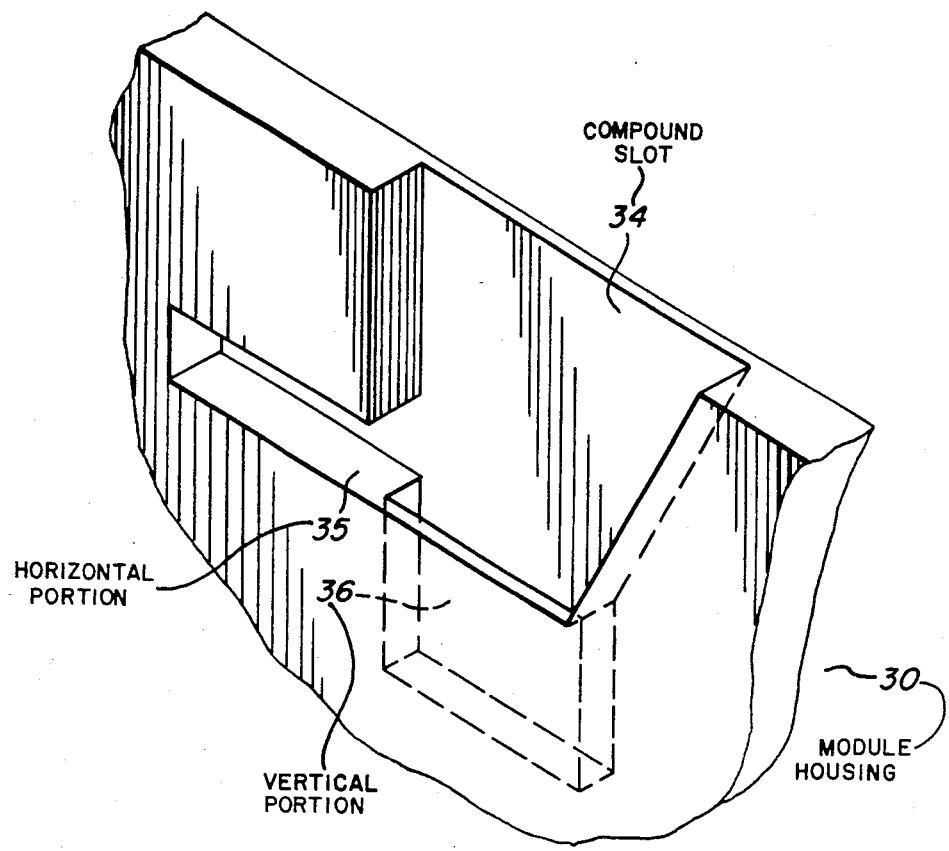
FIG. 2 is a detail of one of the six sets of compound slots found in the module housing that are used to hold the tabs of the retainer plate.

Referring to FIGS. 1 and 2, the assembly of the retainer plate 100 to the module housing 30 is a two step process. First, the retainer plate 100 is inserted into the module housing 30 with the second set of six tabs 102 installed in the vertical portions 36 of the corresponding compound slot 34. Next, the retainer plate 100 is pushed towards the key 31 end of the module housing 30 whereupon the first set of six tabs 101 slide into the horizontal portions 35 of the corresponding compound slot 34. The function of the first set of tabs 101 and the horizontal portions 35 of compound slots 34 is to secure the retainer plate 100 in the module housing 30. The function of the second set of tabs 102 and the vertical portions 36 of compound slots 34 is to prevent lateral deformation of the walls of the module housing 30.

Referring to FIGS. 1 and 3, attachment of the module 10 to the frame 20 is accomplished by sliding the female dovetail 32 over the male dovetail 24, and sliding the protruding key into the keyhole 23. During attachment, resilient contacts 22 protrude through an opening 103 in the retainer plate 100 and contact the module circuit board contacts 74, thereby completing the circuit between the radio board 21 and the module board 70. The resilient contacts 22 are compressed during attachment and remain so afterwards, providing a constant "preload force" on the module board contacts 74. After attachment, a lip 104 on the retainer plate 100 contacts the protrusion 26 on the male dovetail 24 (FIG. 3) and prevents the retainer plate from sliding out of the module housing 30.

To prevent the display module 10 from bowing away from the frame 20, the optional clasp 28 (FIG. 3) and a retainer plate slot 105 (FIG. 1) may be used. The slot 105 has a wide end and a narrow end. During attachment of the display module 10 to the frame 20, the clasp 28 is inserted into the wide end of the slot 105. While engaging the male and female dovetails 24 and 32, and the key and keyhole 31 and 23, the narrow end of slot 105 slides beneath the undercut portion 29 of clasp 28, thereby firmly attaching the middle section of the module housing 30 to the frame 20 and preventing the aforementioned bowing.

Thus, the preferred embodiment of the present invention includes a liquid crystal display 50 with a transparent lens 40 positioned in front of the display. To improve the visibility of the display, a reflecting diffuser 60 is located behind the display 50. The diffuser directs light through the display 50 both by reflect ambient light and by diffusing artificial light originating from two lamps 73 positioned at opposite transparent ends 61 of the diffuser. The lamps 73, a switch 80 which controls the lamps, and display decoder circuitry 71 are mounted on a circuit board 70 situated behind the diffuser 60. A conductive elastomer 90 electrically interconnects the circuit board 70 and the display 50.

The lens 40, display 50, diffuser 60, conductive elastomer 90, and the circuit board 70 with the lamps 73, circuitry 71, and switch 80, are all retained within the module housing by a retainer plate 100. The retainer plate 100 has protruding tabs 101 and 102 that lock the plate in position and also prevent lateral deformation of the module housing 30.

To attach the module 10 to the frame 20, the module housing 30 has a female dovetail 32 and a key 31 that repectively mate with a male dovetail 24 and a slot 23 on the frame. Electrical contacts 74, mounted on the circuit board 70, protrude through an opening 103 in the retainer plate 100 and mate with a corresponding set of contacts 22 in the frame. Complete assembly of the module 10 and its attachment to the frame 20 can be accomplished without the use of tools.

We claim:

1. A radio receiver and detachable display module, comprising in combination:
   a radio receiver and supporting frame;
   a display module housing having an opening sized to receive a character display;
   a retainer plate covering said opening, said retainer plate being the exclusive means for retaining said display and other module components within said module housing;
   means for slidably attaching said retainer plate to said module housing, wherein said retainer plate is placed in contact with said module housing and attached thereto by relative motion in the plane of said retainer plate;
   means for slidably attaching said display module to said frame, wherein said module housing is placed in contact with said frame and attached thereto by relative motion in the plane of contact; and
   a first set of interconnecting electrical contacts located on said radio receiver, and a second set of interconnecting electrical contacts located on said display module, whereby the first set of electrical contacts is engaged with the second set when the display module is attached to the frame.

2. The radio receiver and detachable display module of claim 1, wherein:
   said retainer plate has a plurality of tabs protruding substantially perpendicular from said retainer plate;
   said module housing has a pair of substantially parallel walls, said pair of walls having a plurality of slots suitable for receiving said plurality of tabs;
   whereby inserting the tabs in the slots prevents lateral deformation of the housing walls.

3. The radio receiver and detachable display module of claim 2, wherein:
   a hook shaped clasp is affixed to and protrudes from said frame; and
   an aperture is formed in said retainer plate suitable for receiving said clasp, said aperture having a wide end and a narrow end;
   whereby inserting the clasp into the wide end of the retainer plate aperture and sliding the clasp towards the narrow end attaches the display module to the frame, thereby preventing the display module from bowing away from the frame.

4. The radio receiver and detachable display module of claim 3, wherein:
   said display module further comprises a reflecting diffuser positioned between said display and said retainer plate, said diffuser having a transparent face, a reflecting face, and at least one transparent edge, said transparent face adjoining said display, whereby ambient light passes through the display to the diffuser, whereupon the light is reflected by the reflecting surface of the diffuser back through the display, thereby improving the visibility of the display;
   said display module further comprises a circuit board having at least one lamp, said circuit board being positioned between said diffuser and said retainer plate, said lamp being adjacent to said transparent edge of said diffuser;
   said display module further comprising a switch, integral with said display module, whereby closing the switch activates the lamp which emits light into the transparent edge of the diffuser, whereupon the light is piped through the diffuser, the light being diffused out through the transparent face of the diffuser and through the display, thereby improving the visibility of the display;
   said module housing has a front face, said front face having a transparent lens positioned over said display;
   said display has a set of electrical contacts;
   said circuit board has a set of electrical display contacts;
   said display module further comprises an elastomeric electrical connector, positioned between and in contact with said set of display contacts and said set of circuit board display contacts.

5. The radio receiver and detachable display module of claim 1, wherein:
   a hook shaped clasp is affixed to and protudes from said frame; and
   an aperture is formed in said retainer plate suitable for receiving said clasp, said aperture having a wide end and a narrow end;
   whereby inserting the clasp into the wide end of the retainer plate aperture and sliding the clasp towards the narrow end attaches the display module to the frame, thereby preventing the display module from bowing away from the frame.

6. A radio receiver and detachable display module, comprising in combination:
   a radio receiver and supporting frame, said frame being substantially a rectangular parallelepiped having depth, width and height, said depth being less than said width and said height being approximately ten times said depth, thereby forming first and second sides having depth and height, a top and a bottom having depth and width, and a front and a rear face having width and height, said frame having a male dovetail and a keyhole, both located on said first side of said frame;
   a display module housing containing a character display, said module housing being located on said first side of said frame, said module housing having a first and a second pair of substantially paralle' walls, said first pair of walls being longer than s' second pair, said first pair of walls having a plurality of slots, said module housing furth' ing a female dovetail and a protruding key, said female dovetail and said key being suitable for receiving respectively said male dovetail and said keyhole, whereby the module housing may be slidably attached to the frame;

a first set of interconnecting electrical contacts located on said radio receiver, and a second set of interconnecting electrical contacts located within said module housing, whereby said first set of electrical contacts is forcibly engaged with the second set when the module housing is attached to the frame; and a retainer plate for retaining said display and other module components within said module housing, said retainer plate having a first plurality of tabs protruding from said retainer plate, whereby inserting said first plurality of tabs in said first plurality of module housing slots and sliding the retainer plate in a direction parallel to said first pair of parallel walls, attaches the retainer plate to the module housing.

7. The radio receiver and detachable display module of claim 6, wherein:

said retainer plate has a second plurality of tabs protruding substantially perpendicular from said retainer plate;

said first pair of module housing walls has a second plurality of slots suitable for receiving said second plurality of tabs, whereby inserting the second plurality of tabs in the second plurality of slots prevents lateral deformation of the first pair of module housing walls.

8. The radio receiver and detachable display module of claim 7, wherein:

a hook shaped clasp is affixed to said frame between said male dovetail and said keyhole, said clasp protruding from said frame; and an aperture is formed in said retainer plate suitable for receiving said clasp, said aperture having a wide end and a narrow end;

whereby inserting the clasp into the wide end of the retainer plate aperture and sliding the clasp towards the narrow end of the retainer plate aperture attaches the display module to the frame, thereby preventing the display module from bowing away from the frame.

9. The radio receiver and detachable display module of claim 8, wherein:

said display module further comprises a reflecting diffuser positioned between said display and said retainer plate, said diffuser having a transparent face, a reflecting face, and at least one transparent edge, said transparent face adjoining said display, whereby ambient light passes through the display to the diffuser, whereupon the light is reflected by the reflecting surface of the diffuser back through the display, thereby improving the visibility of the display;

said display module further comprises a circuit board having at least one lamp, said circuit board being positioned between said diffuser and said retainer plate, said lamp being adjacent to said transparent edge of said diffuser;

said display module further comprising a switch, integral with said display module, whereby closing the switch activates the lamp which emits light into the transparent edge of the diffuser, whereupon the light is piped through the diffuser, the light being diffused out through the transparent face of the diffuser and through the display, thereby improving the visibility of the display;

said module housing has a front face, said front face having a transparent lens positioned over said display;

said display has a set of electrical contacts;

said circuit board has a set of electrical display contacts;

said display module further comprises an elastomeric electrical connector, positioned between and in contact with said set of display contacts and said set of circuit board display contacts.

10. The radio receiver and detachable display module of claim 6, wherein:

a hook shaped clasp is affixed to said frame between said male dovetail and said keyhole, said clasp protruding from said frame; and an aperture is formed in said retainer plate suitable for receiving said clasp, said aperture having a wide end and a narrow end;

whereby inserting the clasp into the wide end of the retainer aperture and sliding the clasp towards the narrow end of the retainer plate aperture attaches the display module to the frame, thereby preventing the display module from bowing away from the frame.

* * * * *